(12) United States Patent
Sakai et al.

(10) Patent No.: US 10,060,744 B2
(45) Date of Patent: Aug. 28, 2018

(54) ANGULAR VELOCITY SENSOR (71) Applicant: DENSO CORPORATION, Kariya, Aichi-pref. (JP)

(72) Inventors: Minekazu Sakai, Kariya (JP); Tomoya Jomori, Kariya (JP)

(73) Assignee: DENSO CORPORATION, Kariya (JP)

( * ) Notice: Subject to any disclaimer, the term of this patent is extended or adjusted under 35 U.S.C. 154(b) by 135 days.

(21) Appl. No.: 15/311,547

(22) PCT Filed: Jun. 11, 2015

(86) PCT No.: PCT/JP2015/002918
§ 371 (c)(1),
(2) Date: Nov. 16, 2016

(87) PCT Pub. No.: WO2015/190103
PCT Pub. Date: Dec. 17, 2015

(65) Prior Publication Data
US 2017/0108335 A1    Apr. 20, 2017

(30) Foreign Application Priority Data

Jun. 13, 2014 (JP) ................................ 2014-122512

(51) Int. Cl.
*G01C 19/5607* (2012.01)
(52) U.S. Cl.
CPC ................ *G01C 19/5607* (2013.01)
(58) Field of Classification Search
CPC ............ G01C 19/5607; G01C 19/5614; G01C 19/5621; G01C 19/5628

USPC ....................................................... 73/504.16
See application file for complete search history.

(56) References Cited

U.S. PATENT DOCUMENTS

| | | |
|---|---|---|
| 2006/0107740 A1 | 5/2006 | Ogura |
| 2009/0241663 A1 | 10/2009 | Hori |
| 2013/0270659 A1 | 10/2013 | Jomori et al. |
| 2014/0360265 A1 | 12/2014 | Jomori et al. |
| 2015/0168437 A1 | 6/2015 | Jomori et al. |
| 2016/0123734 A1* | 5/2016 | Nakagawa ............ G01C 19/56 73/504.16 |
| 2016/0126923 A1* | 5/2016 | Nakagawa ............... H03H 9/21 310/370 |
| 2017/0343572 A1* | 11/2017 | Ohkoshi ................ G01P 1/023 |

FOREIGN PATENT DOCUMENTS

| | | |
|---|---|---|
| JP | H07-294262 A | 11/1995 |
| JP | 2011-075415 A | 4/2011 |
| JP | 2013-181856 A | 9/2013 |

* cited by examiner

*Primary Examiner* — Robert R Raevis
(74) *Attorney, Agent, or Firm* — Posz Law Group, PLC (57) ABSTRACT

When one direction of plane directions of a substrate is a first direction and a direction of the plane directions of the substrate perpendicular to the first direction is a second direction, a vibrating member is supported at an outer peripheral section via a plurality of beam sections having first beam-configuring members that can displace at least in the first direction and second beam-configuring members that are joined to the first beam-configuring members and that can displace at least in the second direction. In at least a subset of the plurality of beam sections, beam-configuring members on a side of the outer peripheral section among the first beam-configuring members and the second beam-configuring members are integrated with each other.

4 Claims, 9 Drawing Sheets

FIG. 9

ANGULAR VELOCITY SENSOR

CROSS REFERENCE TO RELATED APPLICATION

This application is a U.S. national stage application of International Patent Application No. PCT/JP2015/002918 filed on Jun. 11, 2015 and is based on Japanese Patent Application No. 2014-122512 filed on Jun. 13, 2014, the disclosure of which is incorporated herein by reference.

TECHNICAL FIELD

The present disclosure relates to an angular velocity sensor having a vibrating member.

BACKGROUND

An angular velocity sensor having a vibrating member with vibrating reeds fixed to a base section is proposed in the related art (see, for example, Patent Literature 1). More specifically, the angular velocity sensor includes a substrate made of a piezoelectric material and the substrate is divided to a part where a vibrating member is provided and a part where an outer peripheral section surrounding the vibrating member is provided. The vibrating member is supported at the outer peripheral section via multiple beam sections.

According to the angular velocity sensor as above, transmission of a disturbance, such as a vibration and an impact, from the outer peripheral section to the vibrating member can be restricted by the beam sections disposed between the vibrating member (base section) and the outer peripheral section. Hence, deterioration of detection accuracy can be restricted.

PATENT LITERATURE

Patent Literature 1: JP2011-75415A

SUMMARY

In the angular velocity sensor as above, however, the respective beam sections are independently connected to the outer peripheral section. Hence, a disturbance restricting effect varies from one beam section to another and deterioration of detection accuracy may not be restricted sufficiently in some cases.

In view of the foregoing difficulties, it is an object of the present disclosure to provide an angular velocity sensor capable of restricting deterioration of detection accuracy.

According to an aspect of the present disclosure, the angular velocity sensor includes a substrate made of a piezoelectric material, a vibrating member provided to the substrate and having a first vibrating reed and a second vibrating reed vibrating in plane directions of the substrate, and an outer peripheral section provided to the substrate and disposed on a periphery of the vibrating member. When an angular velocity is applied to the vibrating member that is vibrating, the vibrating member generates charges corresponding to the angular velocity.

When one direction of the plane directions of the substrate is a first direction and a direction of the plane directions of the substrate perpendicular to the first direction is a second direction, the vibrating member is supported at the outer peripheral section via a plurality of beam sections having first beam-configuring members that can displace at least in the first direction and second beam-configuring members that are joined to the first beam-configuring members and that can displace at least in the second direction, and a base section supporting the first vibrating reed and the second vibrating reed both protruding in a same direction. In at least a subset of the plurality of beam sections, beam-configuring members on a side of the outer peripheral section among the first beam-configuring members and the second beam-configuring members are integrated with each other. When an impact in a direction along an alignment direction of the first vibrating reed and the second vibrating reed is applied to the first vibrating reed, the second vibrating reed, and the base section, let f1 be a resonance frequency in an in-phase mode in which the first vibrating reed, the second vibrating reed, and the base section vibrate in a same direction, f3 be a resonance frequency in an in-phase absorption mode in which a group of the first vibrating reed and the second vibrating reed, and the base section, vibrate in opposite directions, and n be an integer, the resonance frequency f3 in the in-phase absorption mode is higher than the resonance frequency f1 in the in-phase mode and a relation where an absolute value $\Delta f3$, which is a difference between the resonance frequency f3 in the in-phase absorption mode and a value n times the resonance frequency f1 in the in-phase mode, is greater than a product found by multiplying the resonance frequency f1 in the in-phase mode by an avoidant difference D, which indicates a degree of gap of the absolute value $\Delta f3$ from the resonance frequency f1 in the in-phase mode, is satisfied while the avoidant difference D is set to be greater than 0%.

Hence, in a part of the beam sections where the beam-configuring members on the side of the outer peripheral section are integrated with each other, since displacements of the beam sections are coupled to each other, transmission of a disturbance from the outer peripheral section to the vibrating member can be restricted further.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION

Hereafter, referring to drawings, embodiments of the present invention will be described. In addition, the substantially same parts and components are indicated with the same reference numeral and will be described in following embodiments.

First Embodiment

A first embodiment of the present disclosure will be described with reference to drawings. An angular velocity sensor of the present embodiment is suitable to detect an angular velocity applied to a vehicle.

Figure 1:
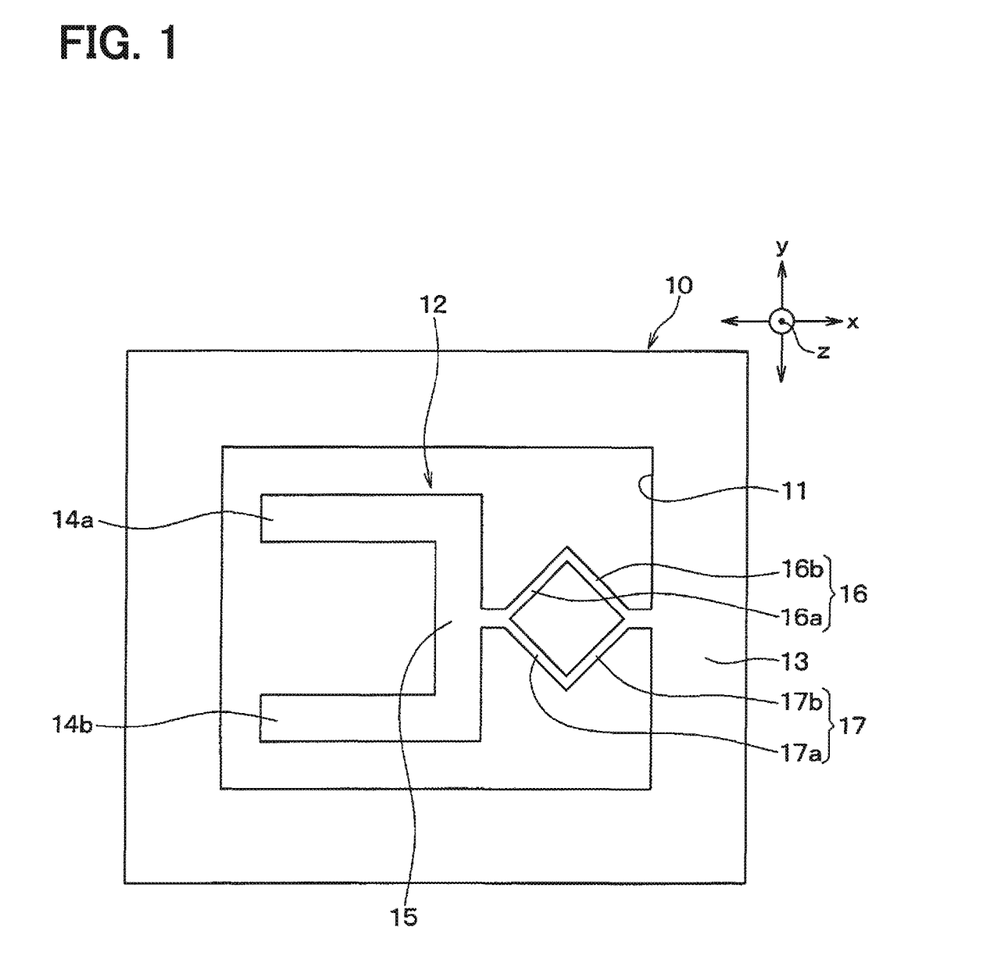
FIG. 1 is a top view of an angular velocity sensor according to a first embodiment of the present disclosure.

As is shown in FIG. 1, the angular velocity sensor includes a substrate 10 made of a piezoelectric material, such as crystal and PZT (lead zirconate titanate). The substrate 10 is micro-machined in a known manner and provided with a groove section 11. The substrate 10 is divided by the groove section 11 to a part where a vibrating member 12 is provided and a part where an outer peripheral section 13 is provided. It should be noted that the outer peripheral section 13 is provided in a part divided from the vibrating member 12 so as to be located on a periphery of the vibrating member 12.

The vibrating member 12 includes a first vibrating reed 14a and a second vibrating reed 14b both held by a base section 15. To be more specific, the base section 15 is of a flat rectangular shape having a longitudinal direction (a top-bottom direction on a sheet surface of FIG. 1). The first vibrating reed 14a and the second vibrating reed 14b are located respectively at both ends of the base section 15 in the longitudinal direction and protrude in a same direction. In short, the vibrating member 12 of the present embodiment is of so-called a tuning-fork type.

Each of the vibrating reeds 14a and 14b is provided with a drive electrode and a detection electrode, neither of which is shown. For example, the drive electrode is provided to each of the vibrating reeds 14a and 14b on a side of the base section 15 and the detection electrode is provided to each of the vibrating reeds 14a and 14b on an opposite side to the base section 15.

The vibrating member 12 is supported at the outer peripheral section 13 via a first beam section 16 and a second beam section 17. A specific configuration of the first beam section 16 and the second beam section 17 will now be described. Hereinafter, a description will be given by defining a protruding direction of the first vibrating reed 14a and the second vibrating reed 14b with respect to the base section 15 (a right-left direction on the sheet surface of FIG. 1) as an x-axis direction, a direction perpendicular to the protruding direction within a plane of the substrate 10 (an alignment direction of the first vibrating reed 14a and the second vibrating reed 14b) as a y-axis direction, and a direction normal to plane directions of the substrate 10 as a z-axis direction. In the present embodiment, the y-axis direction corresponds to a first direction, the x-axis direction corresponds to a second direction, and the z-axis direction corresponds to a third direction.

The first beam section 16 includes a first beam-configuring member 16a and a second beam-configuring member 16b tilted with respect to the x-axis direction and the y-axis direction. In other words, the first beam section 16 includes the first beam-configuring member 16a and the second beam-configuring member 16b that can displace in the x-axis direction and the y-axis direction. The first beam-configuring member 16a is disposed on a side of the vibrating member 12 and the second beam-configuring member 16b is disposed on a side of the outer peripheral section 13 and the first beam-configuring member 16a and the second beam-configuring member 16b are joined to each other. Hence, the first beam section 16 is formed in substantially a V shape.

Likewise, the second beam section 17 includes a first beam-configuring member 17a and a second beam-configuring member 17b tilted with respect to the x-axis direction and the y-axis direction. In other words, the second beam section 17 includes the first beam-configuring member 17a and the second beam-configuring member 17b that can displace in the x-axis direction and the y-axis direction. The first beam-configuring member 17a is disposed on the side of the vibrating member 12 and the second beam-configuring member 17b is disposed on the side of the outer peripheral section 13 and the first beam-configuring member 17a and the second beam-configuring member 17b are joined to each other. Hence, the second beam section 17 is formed in substantially a V shape. The substantial V shape formed by the second beam section 17 is inverted from the substantial V shape formed by the first beam section 16 and has a convex portion on an opposite side.

The first beam section 16 and the second beam section 17 are joined to the vibrating member 12 while respective ends of the first beam-configuring members 16a and 17a on the side of the vibrating member 12 are joined and integrated with each other. Also, the first beam section 16 and the second beam section 17 are joined to the outer peripheral section 13 while respective ends of the second beam-configuring members 16b and 17b on the side of the outer peripheral section 13 are joined and integrated with each other. Hence, it can be said in the present embodiment that the first beam section 16 and the second beam section 17 together form a beam section of a flat frame shape and are joined to the vibrating member 12 and the outer peripheral section 13 at one of two sets of opposing corners of the frame-shaped beam section.

In the present embodiment, a spring constant of the first beam section 16 and the second beam section 17 is set to be smaller than a spring constant of the first vibrating reed 14a and the second vibrating reed 14b by appropriately adjusting sectional areas, lengths, and the like.

Figure 2:
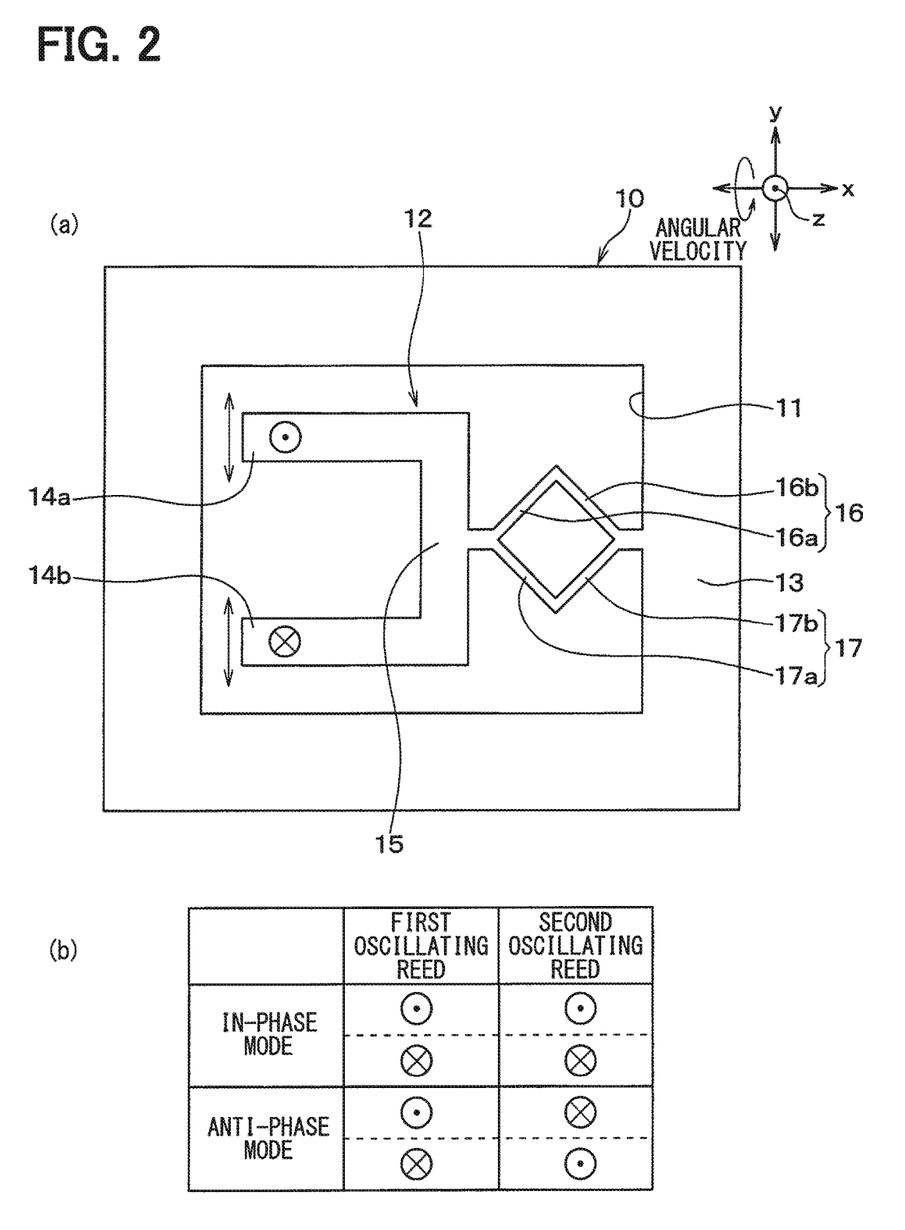
FIG. 2(a) is a view showing an operation of the angular velocity sensor shown in FIG. 1.
FIG. 2(b) is a view showing patterns of the operations of angular velocity sensor shown in FIG. 2(a)

When the angular velocity sensor as above detects an angular velocity, drive signals are applied to the drive electrodes provided to the first vibrating reed 14a and the second vibrating reed 14b. The drive signals applied to the first vibrating reed 14a and the second vibrating reed 14b are pulsed drive signals at a predetermined frequency having predetermined amplitude and 180° out of phase with each other. Accordingly, as is shown in FIGS. 2(a) and 2(b), the first vibrating reed 14a and the second vibrating reed 14b are driven to vibrate oppositely along the y-axis direction. In other words, the first vibrating reed 14a and the second vibrating reed 14b are driven to vibrate like opening and closing together.

When an angular velocity about the x-axis direction is applied in such a state, the first vibrating reed 14a and the second vibrating reed 14b vibrate oppositely in the z-axis direction due to a Coriolis force. For example, when the first vibrating reed 14a vibrates in a downward direction perpendicular to a sheet surface in FIG. 2(a), the second vibrating reed 14b vibrates in an upward direction perpendicular to the sheet surface in FIG. 2(a). Eventually, charges corresponding to vibrations are generated at the unillustrated detection electrodes provided to the first vibrating reed 14a and the second vibrating reed 14b. Hence, an angular velocity is detected by applying a differential amplification to the charges generated at the respective detection electrodes. As shown in FIG. 2(a) and FIG. 2(b), a circle with a dot at the center indicates vibrations in the downward direction perpendicular to the sheet surface and a circle with an x at the center indicates vibrations in the upward direction perpendicular to the sheet surface.

Herein, the vibrating member 12 is supported at the outer peripheral section 13 via the first beam section 16 and the second beam section 17. Hence, transmission of a disturbance, such as a vibration and an impact, from the outer peripheral section 13 to the vibrating member 12 can be restricted as the first beam section 16 and the second beam section 17 displace (bend) in the x-axis direction and the y-axis direction.

The second beam-configuring members 16b and 17b, respectively, of the first beam section 16 and the second beam section 17 are integrated with each other. Hence, because displacement of the first beam section 16 and displacement of the second beam section 17 are coupled to each other, transmission of a disturbance from the outer peripheral section 13 to the vibrating member 12 can be restricted further.

While an angular velocity is detected according to a detection principle as described above, the first vibrating reed 14a and the second vibrating reed 14b have a resonance frequency fin in an in-phase mode in which the first vibrating reed 14a and the second vibrating reed 14b vibrate in a same direction along the z-axis direction and a resonance frequency fanti in an anti-phase mode in which the first vibrating reed 14a and the second vibrating reed 14b vibrate in directions opposite to each other along the z-axis direction.

As is shown in FIG. 2(b), the term, "in-phase mode", referred to herein means that the first vibrating reed 14a and the second vibrating reed 14b are forced to vibrate in the same direction along the z-axis direction when an impact along the z-axis direction is applied. Also, the term, "anti-phase mode", referred to herein means that the first vibrating reed 14a and the second vibrating reed 14b are forced to vibrate in the opposite directions along the z-axis direction when an impact along the z-axis direction is applied.

Given that the first vibrating reed 14a and the second vibrating reed 14b change in the in-phase mode when an impact in the z-axis direction is applied, then, charges (signals) generated by impact-induced vibrations are cancelled out by applying a differential amplification (differential output) to charges generated at the respective detection electrodes provided to the first vibrating reed 14a and the second vibrating reed 14b. However, when the first vibrating reed 14a and the second vibrating reed 14b change in the anti-phase mode when an impact in the z-axis direction is applied, charges (signals) generated by impact-induced vibrations are not cancelled out by the differential amplification and appear as an output error, which deteriorates detection accuracy.

Figure 3:
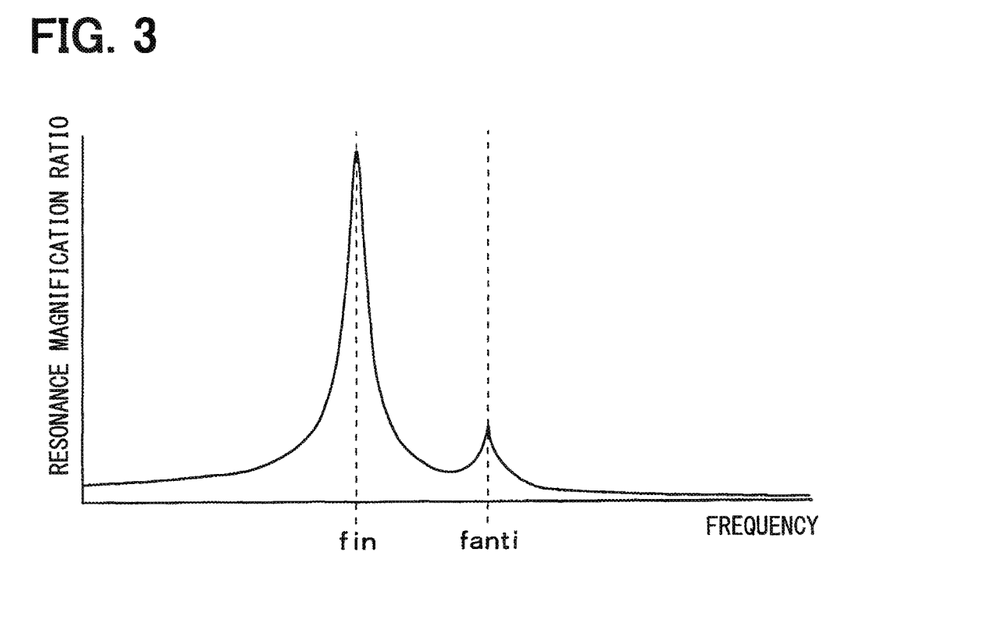
FIG. 3 is a view showing a frequency characteristic (response curve) of a resonance magnification ratio of a typical angular velocity sensor.

When an impact in the z-axis direction is applied, a resonance magnification ratio (response strength) varies with a frequency component included in the impact. More specifically, in a typical angular velocity sensor (an angular velocity sensor designed without consideration of a resonance frequency), as is shown in FIG. 3, a frequency characteristic (response curve) of the resonance magnification ratio reaches a maximum resonance magnification ratio at the resonance frequency fin in the in-phase mode. The resonance magnification ratio decreases sharply in other frequency ranges centered at the resonance frequency fin in the in-phase mode and the resonance magnification ratio becomes lower as the resonance frequency becomes higher or lower than the resonance frequency fin. It should be noted, however, that the resonance frequency fanti in the anti-phase mode is present besides the resonance frequency fin in the in-phase mode and the resonance magnification ratio also increases to some extent at the resonance frequency fanti in the anti-phase mode, although an increase is sufficiently smaller than an increase at the resonance frequency fin in the in-phase mode. A component of the resonance frequency fanti in the anti-phase mode included in the impact induces motion forcing the first vibrating reed 14a and the second vibrating reed 14b to vibrate in the opposite directions, which gives rise to an output error.

A resonance magnification ratio at the resonance frequency fanti in the anti-phase mode becomes higher as the resonance frequency fanti presents to be closer to the resonance frequency fin in the in-phase mode. That is to say, as is shown in FIG. 3, the resonance magnification ratio attenuates over the frequency ranges centered at the resonance frequency fin in the in-phase mode. However, in a case where the resonance frequency fanti in the anti-phase mode is too close to the resonance frequency fin in the in-phase mode, when an impact is applied, the resonance magnification ratio is in a region where a component of the resonance frequency fanti in the anti-phase mode included in the impact does not attenuate sufficiently. Accordingly, the insufficiently attenuated component of the resonance frequency fanti in the anti-phase mode included in the impact induces motion in the anti-phase mode for vibrations.

Figure 4:
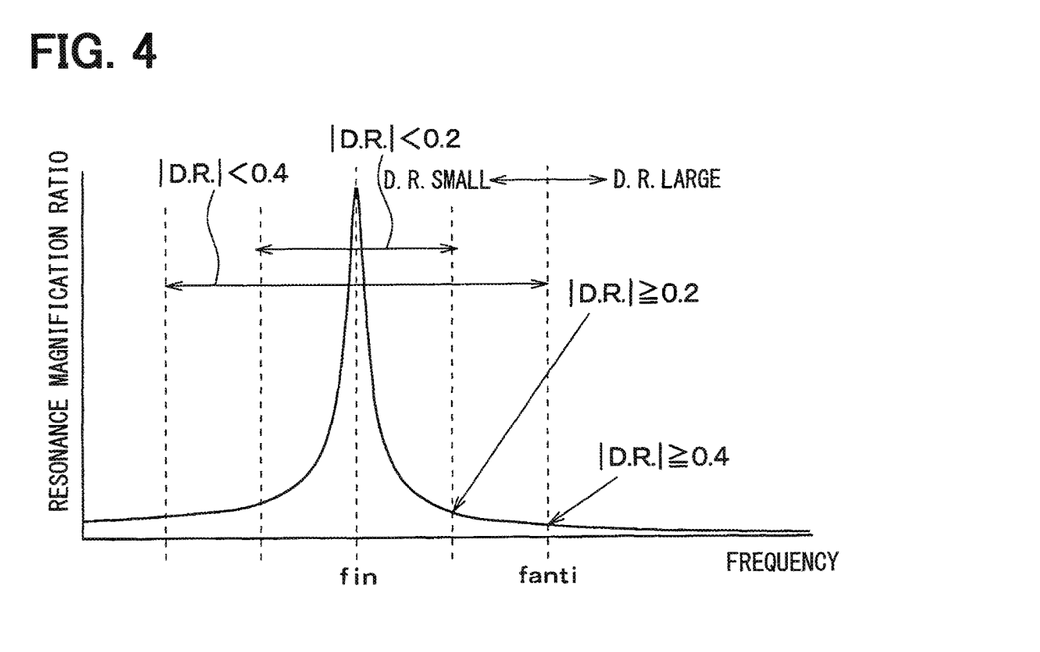
FIG. 4 is a view showing a frequency characteristic (response curve) of a resonance magnification ratio of the angular velocity sensor of the first embodiment.

Accordingly, by separating the resonance frequency fin in the in-phase mode and the resonance frequency fanti in the anti-phase mode, the resonance magnification ratio can be in a region where a component of the resonance frequency fanti in the anti-phase mode included in the impact sufficiently attenuates. Hence, it can be said that induction of motion in the anti-phase mode can be restricted. The frequency characteristic of the resonance magnification ratio can be adjusted by setting springs allowed to displace in the z-axis direction, that is, by setting the first vibrating reed 14a and the second vibrating reed 14b in the present embodiment. As is shown in FIG. 4, when the resonance frequency fanti in the anti-phase mode is away from the resonance frequency fin in the in-phase mode, the resonance magnification ratio at the resonance frequency fanti in the anti-phase mode can be lowered.

More specifically, a quotient found by dividing a difference between the resonance frequency fanti in the anti-phase mode and the resonance frequency fin in the in-phase mode by the resonance frequency fanti in the anti-phase mode (=(fanti−fin)/fanti) is defined as a decoupling ratio (hereinafter, abbreviated to D.R.). Then, by setting an absolute value of D.R. to 0.2 or greater, the resonance magnification ratio is 3 or less within an error of about ten percent regardless of whether a peak value (Q-value: resonance magnification ratio at the resonance frequency fin) is large or small. Hence, the resonance magnification ratio can be in a region where robustness is secured. More preferably, when an absolute value of D.R. is 0.4 or greater, the resonance magnification ratio at the resonance frequency fanti in the anti-phase mode can be set to 1 or less and a component of the resonance frequency fanti in the anti-phase mode included in an impact attenuates more sufficiently. Hence, induction of motion in the anti-phase mode can be restricted. For example, given that the resonance frequency fin in the in-phase mode is 10 kHz and the resonance frequency fanti in the anti-phase mode is 16 kHz, then an absolute value of D.R. is 0.4 or greater. Consequently, the resonance magnification ratio can be set to 1 or less.

Accordingly, in the present embodiment, an absolute value of D.R. is 0.2 or greater, more preferably, 0.4 or greater. Consequently, induction of motion in the anti-phase mode can be restricted. An output error of the angular velocity sensor can be therefore restricted and hence deterioration of detection accuracy can be restricted further.

Incidentally, the angular velocity sensor as above has two frequencies f1 and f3 in a resonance mode for an application of an impact along the y-axis direction. More specifically, as is schematically shown in FIG. 5, one frequency is a resonance frequency f1 in an in-phase mode in which two weights m1 and m2 supported, respectively, at springs s1 and s2 are forced to vibrate in a same direction, and the other frequency is a resonance frequency f3 in an in-phase absorption mode in which the two weights m1 and m2 are forced to vibrate in opposite directions.

Figure 5:
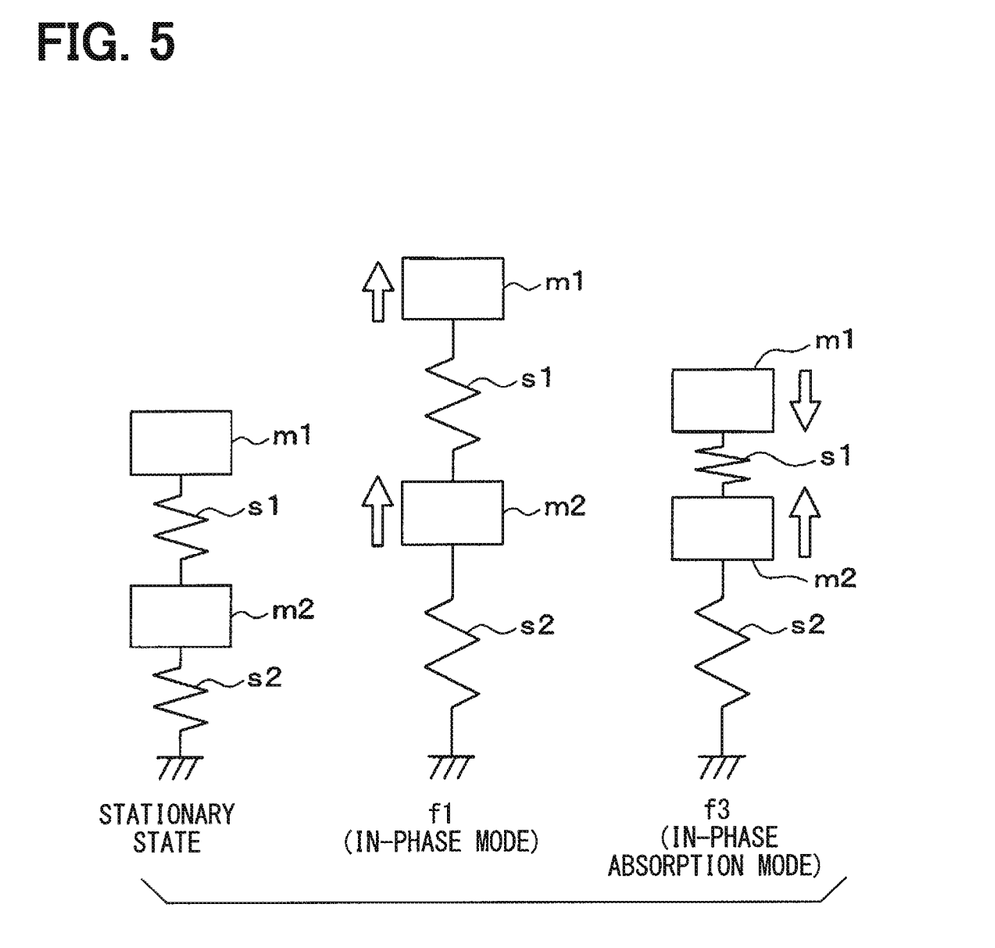
FIG. 5 is a schematic view showing motion in an in-phase mode and in an in-phase absorption mode in comparison with a stationary state.

In FIG. 5, the spring s2 is formed of the first beam section 16 and the second beam section 17, the weight m2 is formed of the base section 15, the spring s1 is formed of the first vibrating reed 14a and the second vibrating reed 14b, and the weight m1 is also formed of the first vibrating reed 14a and the second vibrating reed 14b. The resonance frequency f3 in the in-phase absorption mode is a frequency higher than the resonance frequency f1 in the in-phase mode.

Figure 6A:
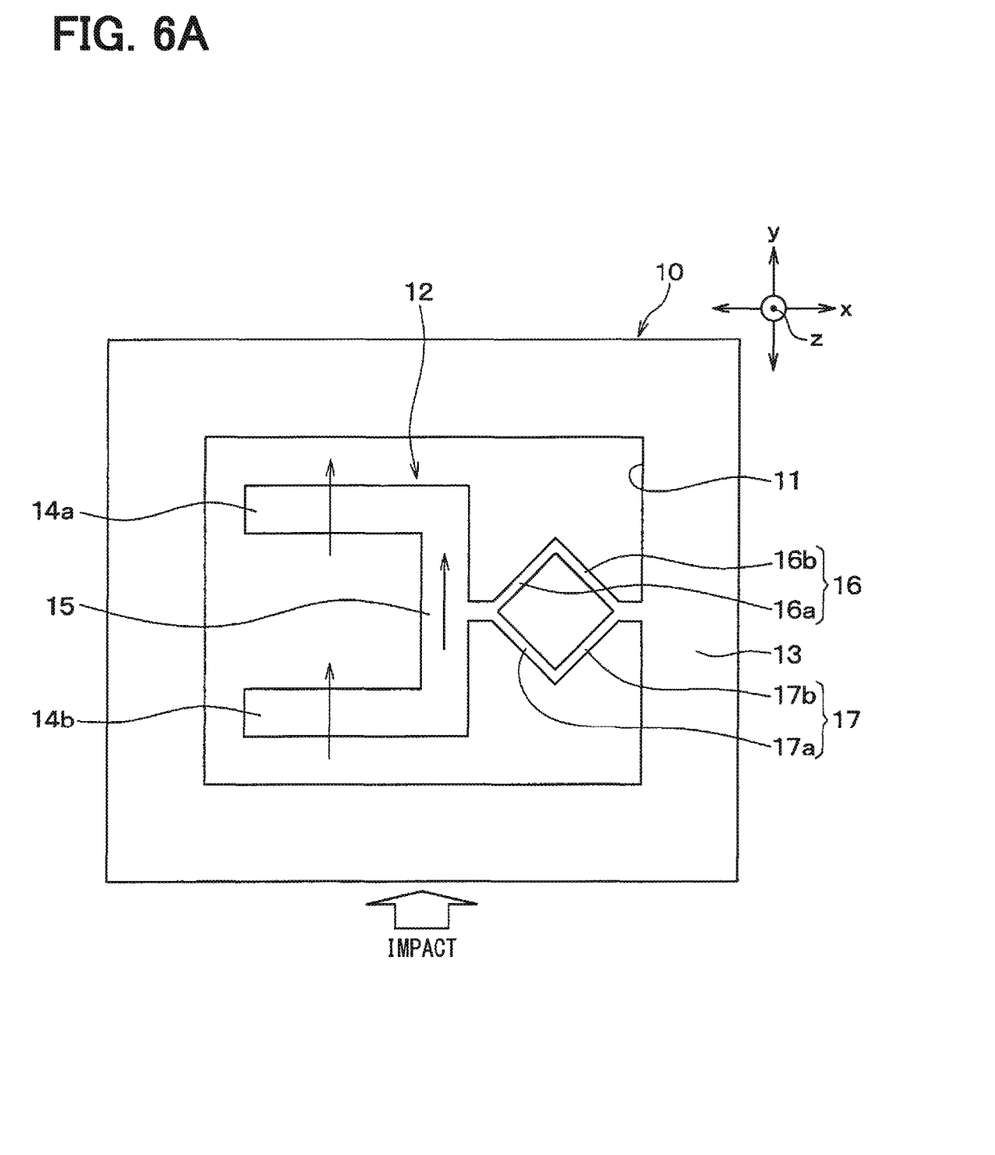
FIG. 6A is a schematic view showing motion in the in-phase mode when an impact in a y-axis direction is applied to the angular velocity sensor shown in FIG. 1.
Figure 6B:
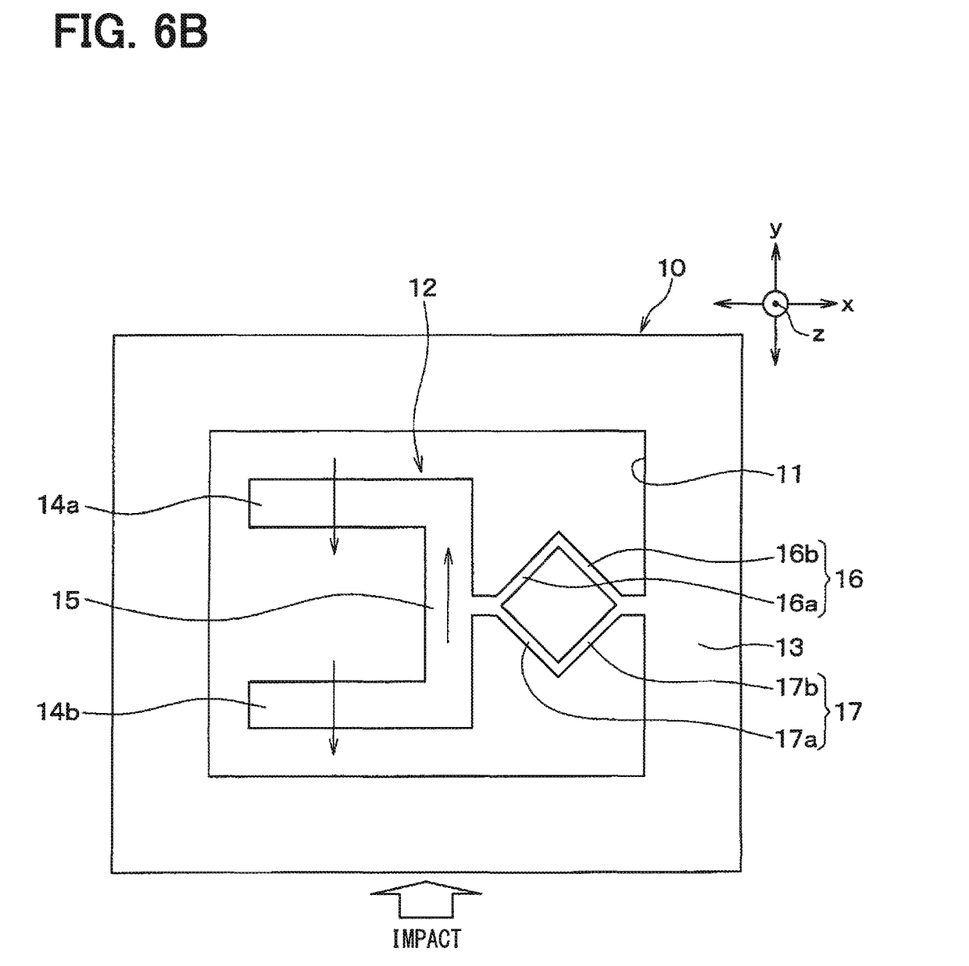
FIG. 6B is a schematic view showing motion in the in-phase absorption mode when an impact in the y-axis direction is applied to the angular velocity sensor shown in FIG. 1.

That is to say, as is shown in FIG. 6A, when an impact in the y-axis direction is applied to the angular velocity sensor, the first vibrating reed 14a, the second vibrating reed 14b, and the base section 15 are forced to vibrate in a same direction along the y-axis direction at the resonance frequency f1 in the in-phase mode. In contrast, as is shown in FIG. 6B, when an impact in the y-axis direction is applied to the angular velocity sensor, a group of the first vibrating reed 14a and the second vibrating reed 14b, and the base section 15, are forced to vibrate in opposite directions along the y-axis direction at the frequency resonance f3 in the in-phase absorption mode.

When an impact in the y-axis direction is applied to the angular velocity sensor, the first vibrating reed 14a, the second vibrating reed 14b, and the base section 15 are forced to vibrate by a displacement mechanism realized by adding up three vibration excitations: a first vibration excitation not by resonance, a second vibration excitation by resonance, and a third vibration excitation by resonance interference. In short, the first vibrating reed 14a, the second vibrating reed 14b, and the base section 15 displace (forced to vibrate) as the first through third vibration excitations are generated and added up at a time.

The first vibration excitation not by resonance is a displacement amount simply calculated from an inertial force and a spring force and the second vibration excitation by resistance is an excitation amount calculated from an application time of an impact component at a frequency as high as the resonance frequency f1 in the resonance mode, chiefly the in-phase mode of the angular velocity sensor and a Q-value (peak value of the resonance magnification ratio) unique to the vibrating member 12. Also, the third vibration excitation by resonance interference is an excitation amount by interference between an integral multiple (n times) of the resonance frequency f1 in the in-phase mode and the resonance frequency f3 in the in-phase absorption mode.

A gain A corresponding to a degree of influence of the third vibration excitation by resonance interference is expressed by a mathematical formula below. The mathematical formula below means that displacement is increased by A times of displacement in a state where the third vibration excitation by resonance interference is sufficiently reduced to or in the neighborhood of the first vibration excitation not by resonance or the second vibration excitation by resonance.

$$A = \frac{\left(\frac{n \cdot f1}{f3}\right)^2}{\sqrt{\left\{1 - \left(\frac{n \cdot f1}{f3}\right)^2\right\}^2 + \left(\frac{n \cdot f1}{f3 \cdot Q}\right)^2}} \quad (1)$$

where f1 is the resonance frequency f1 in the in-phase mode, f3 is the resonance frequency f3 in the in-phase absorption mode, n is an integer, and Q is the Q-value.

Figure 7:
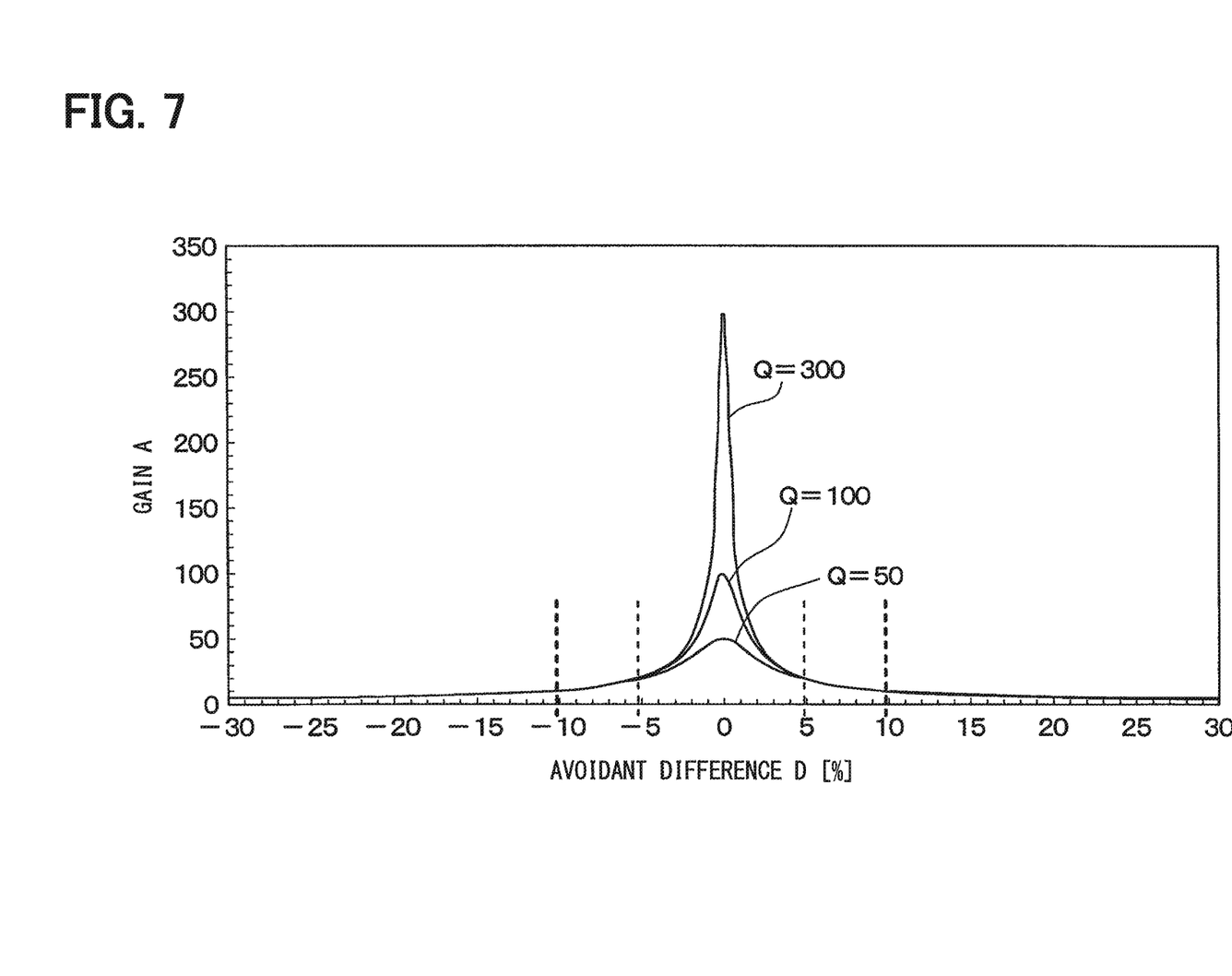
FIG. 7 is a graph of Mathematical Formula 1 when a Q-value is varied.

FIG. 7 shows a graph of Mathematical Formula 1 above when the Q-value is varied. In FIG. 7, an avoidant difference D indicates a degree of gap of an absolute value Δf3, which is a difference between the resonance frequency f3 in the in-phase absorption mode and a value n times the resonance frequency f1 in the in-phase mode, from the resonance frequency f1 in the in-phase mode.

As is shown in FIG. 7, the gain A reaches a maximum when the avoidant difference D is 0 (D=0), that is, when the absolute value Δf3 coincides with the resonance frequency f1 in the in-phase mode. In such a case, the third vibration excitation by resonance interference appears as a largest peak value and has a higher contribution ratio in all of the vibration excitations.

Hence, by designing the angular velocity sensor not to satisfy a condition that the absolute value Δf3 (=|f3−n×f1|) coincides with the resonance frequency f1 in the in-phase mode, the third vibration excitation by resonance interference does not take the largest peak value and a contribution ratio in all of the vibration excitations can be reduced. That is to say, in a relation where the absolute value Δf3 becomes greater than a product found by multiplying the resonance frequency f1 in the in-phase mode by the avoidant difference D (Δf3>f1×D), at least the avoidant difference D is set not to be 0% (D≠0) and greater than 0%. Consequently, the third vibration excitation by resonance interference can avoid resulting in largest displacement.

By designing the angular velocity sensor such that the avoidant difference D is greater than 5% (D>5%), in the square root as the denominator in Mathematical Formula 1 above, the first term takes a sufficiently larger value than a value of the second term. Hence, the gain A can be determined independently of the Q-value in the second term. To be more specific, as is shown in FIG. 7, the gain A is lowered to about 20. In the manner as above, the gain A can be set independently of the Q-value and the gain A can be sufficiently small. Consequently, robustness can be increased.

By designing the angular velocity sensor such that the avoidant difference D is greater than 10% (D>10%), as is shown in FIG. 7, the gain A is lowered to as low as a single-digit figure. Consequently, vibrations can be restricted in a state where the third vibration excitation by resonance interference is sufficiently reduced to or in the neighborhood of the first vibration excitation not by resonance or the second vibration excitation by resonance.

FIG. 7 shows a case where the Q-value is varied in a range of 50 to 300 by way of example. It should be appreciated, however, that the Q-value is not limited to the range specified above.

Accordingly, in the present embodiment, regarding the resonance frequency f1 in the in-phase mode and the resonance frequency f3 in the in-phase absorption mode higher than the resonance frequency f1, the absolute value $\Delta f3$, which is a difference between the resonance frequency f3 in the in-phase absorption mode and a value n times the resonance frequency f1 in the in-phase mode, satisfies a condition as follows. That is, at least the avoidant difference D is greater than 0% in a relation where the absolute value $\Delta f3$ is greater than a product found by multiplying the resonance frequency f1 in the in-phase mode by the avoidant difference D ($\Delta f3 > f1 \times D$). Consequently, the third vibration excitation by resonance interference can avoid resulting in largest displacement.

Preferably, when the avoidant difference D is greater than 5% (D>5%), the gain A can be reduced independently of the Q-value and therefore robustness can be increased. More preferably, when the avoidant difference D is greater than 10% (D>10%), the gain A can be lowered to as low as a single-digit figure. Consequently, vibrations can be restricted in a state where the third vibration excitation by resonance interference is sufficiently reduced to or in the neighborhood of the first vibration excitation not by resonance or the second vibration excitation by resonance.

When the angular velocity sensor is designed by setting the resonance frequency f1 in the in-phase mode and the resonance frequency f3 in the in-phase absorption mode so as to satisfy the relation as above, the third vibration excitation by resonance interference can be reduced.

As is indicated by Mathematical Formula 1 above, the gain A is defined by an integral multiple (n times) of the resonance frequency f1 in the in-phase mode, the resonance frequency f3 in the in-phase absorption mode, and the Q-value. Hence, the gain A can be lowered also by reducing the Q-value in Mathematical Formula 1 above. For example, because the angular velocity sensor of the present embodiment is generally used in a vacuum-sealed state, the Q-value can be reduced by reducing a degree of vacuum when sealed. By reducing the Q-value as above, the gain A can be lowered and further the third vibration excitation by resonance interference can be reduced. Also, because the second vibration excitation by resonance is also reduced by reducing the Q-value, the second vibration excitation by resonance is reduced with the third vibration excitation by resonance interference. Consequently, impact-resistance performance can be enhanced further.

As has been described above, in the present embodiment, the vibrating member 12 is supported at the outer peripheral section 13 via the first beam section 16 and the second beam section 17. Hence, transmission of a disturbance, such as a vibration and an impact, from the outer peripheral section 13 to the vibrating member 12 can be restricted as the first beam section 16 and the second beam section 17 displace (bend) in the x-axis direction and the y-axis direction.

The second beam-configuring members 16b and 17b, respectively, of the first beam section 16 and the second beam section 17 are integrated with each other. Hence, displacement of the first beam section 16 and displacement of the second beam section 17 are coupled to each other. Consequently, transmission of a disturbance from the outer peripheral section 13 to the vibrating member 12 can be restricted further and hence deterioration of detection accuracy can be restricted further.

In addition, a spring constant of the first beam section 16 and the second beam section 17 is set to be smaller than a spring constant of the first vibrating reed 14a and the second vibrating reed 14b. Hence, transmission of a disturbance from the outer peripheral section 13 to the vibrating member 12 can be restricted in comparison with a case where a spring constant of the first beam section 16 and the second beam section 17 is set to be larger than a spring constant of the first vibrating reed 14a and the second vibrating reed 14b.

Further, an absolute value of D.R. is set to 0.2 or greater in the present embodiment. Hence, even when an impact in the z-axis direction is applied to the angular velocity sensor, induction of motion in the anti-phase mode can be restricted. Consequently, an occurrence of an output error can be restricted and hence deterioration of detection accuracy can be restricted further.

In the present embodiment, at least the avoidant difference D is greater than 0% in a relation where the absolute value $\Delta f3$ is greater than a product found by multiplying the resonance frequency f1 in the in-phase mode by the avoidant difference D ($\Delta f3 > f1 \times D$). Consequently, the vibration excitation by resonance interference can be restricted from resulting in largest displacement and hence impact-resistance performance can be enhanced.

Second Embodiment

A second embodiment of the present disclosure will be described. In the present embodiment, a configuration of the first beam section 16 and the second beam section 17 is changed from the configuration of the first embodiment above. Because the rest is same as the first embodiment above, a description of the rest is omitted herein.

Figure 8:
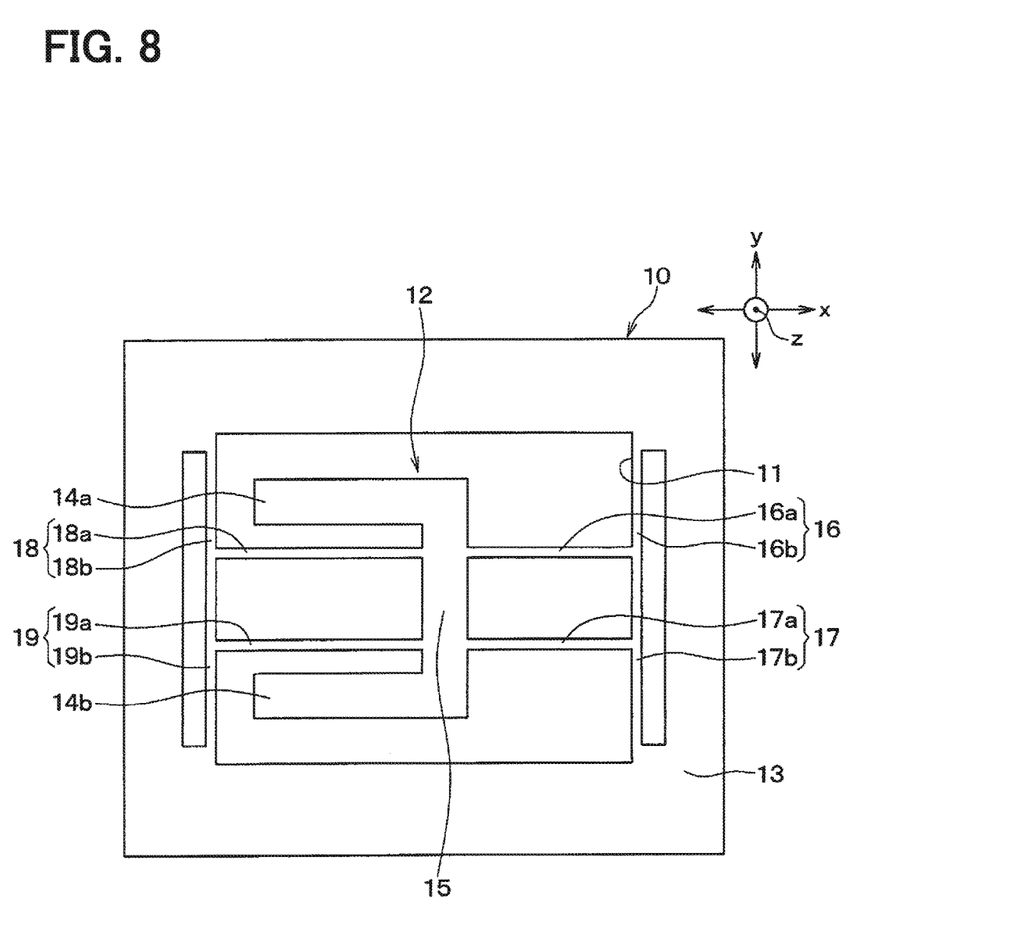
FIG. 8 is a top view of an angular velocity sensor according to a second embodiment of the present disclosure.

As is shown in FIG. 8, in the present embodiment, the vibrating member 12 is supported at the outer peripheral section 13 via the first beam section 16 and the second beam section 17 as well as a third beam section 18 and a fourth beam section 19 disposed on an opposite side to the first beam section 16 and the second beam section 17 with the vibrating member 12 in between.

The first beam section 16 and the second beam section 17 respectively have first beam-configuring members 16a and 17a extending in an x-axis direction and second beam-configuring members 16b and 17b extending in a y-axis direction and joined to the first beam-configuring members 16a and 17a, respectively. That is to say, the first beam section 16 and the second beam section 17 respectively have the first beam-configuring members 16a and 17a that can displace in the y-axis direction and the second beam-configuring members 16b and 17b that can displace in the x-axis direction. The second beam-configuring member 16b of the first beam section 16 and the second beam-configuring member 17b of the second beam section 17 are integrated with each other.

Likewise, the third beam section 18 and the fourth beam section 19 respectively have first beam-configuring members 18a and 19a extending in the x-axis direction and second beam-configuring members 18b and 19b extending in the y-axis direction and joined to the first beam-configuring members 18a and 19a, respectively. That is to say, the third beam section 18 and the fourth beam section 19 respectively have the first beam-configuring members 18a and 19a that can displace in the y-axis direction and the second beam-configuring members 18b and 19b that can displace in the x-axis direction. The second beam-configuring member 18b of the third beam section 18 and the second beam-configuring member 19b of the fourth beam section 19 are integrated with each other.

The angular velocity sensor may include the first through fourth beam sections 16 to 19 and the respective first and second beam-configuring members 16a to 19b may displace only in one direction as above. Even when the angular velocity sensor is configured in such a manner, the second beam-configuring members 16b and 17b, respectively, of the first beam section 16 and the second beam section 17 are integrated with each other and the second beam-configuring members 18b and 19b, respectively, of the third beam section 18 and the fourth beam section 19 are integrated with each other. Hence, an effect same as the effect of the first embodiment above can be obtained.

Third Embodiment

A third embodiment of the present disclosure will be described. In the present embodiment, a configuration of second beam-configuring members 16b to 19b is changed from the configuration of the second embodiment above. Because the rest is same as the second embodiment above, a description of the rest is omitted herein.

Figure 9:
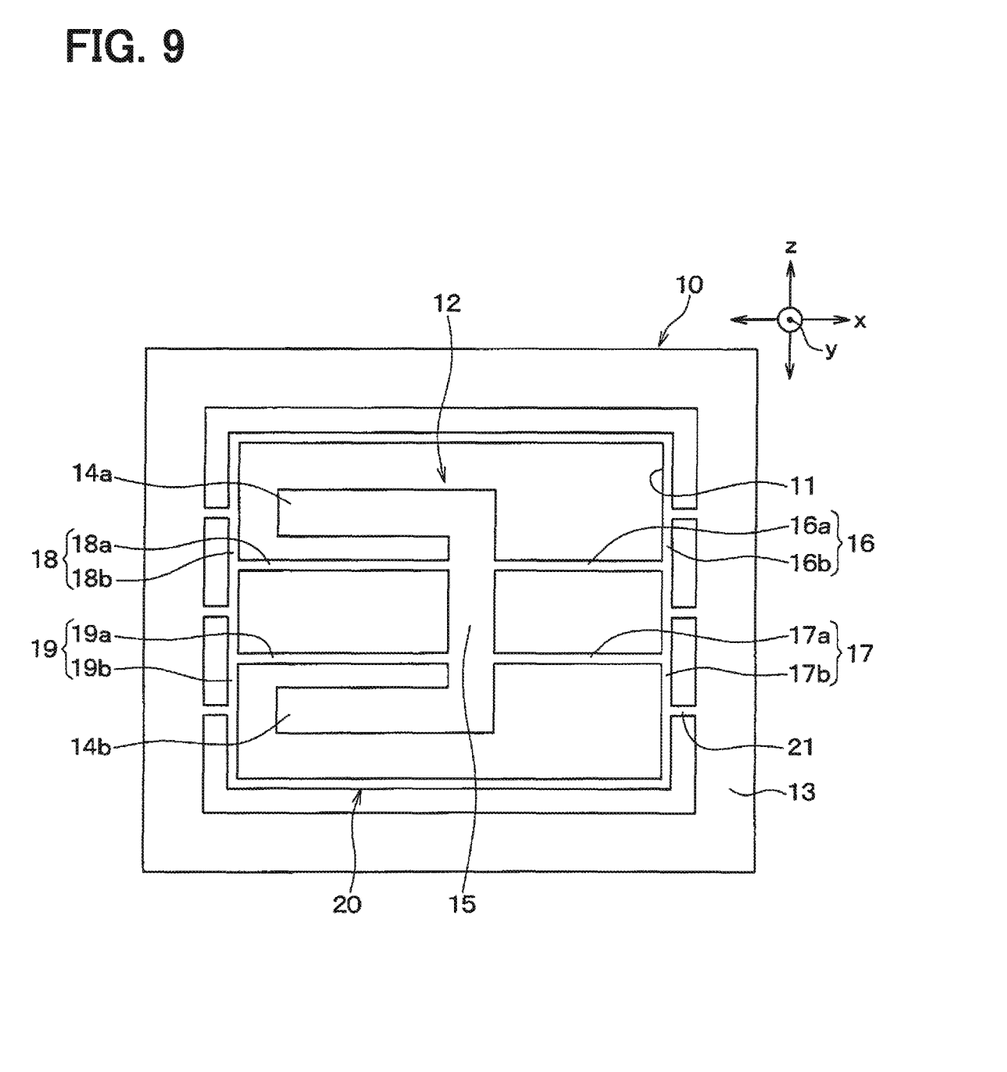
FIG. 9 is a top view of an angular velocity sensor according to a third embodiment of the present disclosure.

In the present embodiment, as is shown in FIG. 9, a frame section 20 surrounding the vibrating member 12 is provided between the vibrating member 12 and the outer peripheral section 13. The frame section 20 is supported at the outer peripheral section 13 via multiple support sections 21. Respective first beam-configuring members 16a to 19a are joined to the frame section 20 and the second beam-configuring members 16b to 19b are formed of the frame section 20. In short, all of the second beam-configuring members 16b to 19b, respectively, of first through fourth beam sections 16 to 19 are integrated with one another.

According to the configuration as above, an effect same as the effect of the second embodiment above can be obtained while transmission of a disturbance from the outer peripheral section 13 to the vibrating member 12 can be restricted further by the first through fourth beam sections 16 to 19 because displacement of each of the beam sections 16 to 19 is coupled to one another.

The above has described the configuration in which the frame section 20 (the second beam-configuring members 16b to 19b of the first through fourth beam sections 16 to 19, respectively) is supported at the outer peripheral section 13 via the multiple support sections 21. It should be appreciated, however, that the frame section 20 may be supported at the outer peripheral section 13 via only one support section 21.

Other Embodiments

The present disclosure is not limited to the embodiments mentioned above, and can be changed and modified to various embodiments which are also within the spirit and scope of the present disclosure.

For example, the configuration of the vibrating member 12 may be changed in the respective embodiments above. More specifically, the vibrating member 12 may be so-called an H-shaped tuning fork having the first vibrating reed 14a and the second vibrating reed 14b protruding from the base section 15 in both directions.

Further, the vibrating member 12 may be so-called a tripod tuning fork having a detection reed protruding in the same direction as the first vibrating reed 14a and the second vibrating reed 14b and disposed between the first vibrating reed 14a and the second vibrating reed 14b. In such a case, the first vibrating reed 14a and the second vibrating reed 14b serve as driving reeds and an angular velocity is detected on the basis of charges generated at the detection reed. Because the vibrating member 12 configured as above has only one detection reed, an angular velocity is detected on the basis of charges generated at the detection reed. In short, an angular velocity is detected without performing the differential amplification.

Further, the vibrating member 12 may be so-called a double-T-shaped tuning fork having the first vibrating reed 14a, the second vibrating reed 14b, and the detection reed protruding from both sides of the base section 15.

In the first embodiment above, ends of the first beam-configuring members 16a and 17a on the side of the base section 15 may not be integrated with each other and may be provided to the base section 15.

In the respective embodiments above, a spring constant of the respective beam sections 16 to 19 may be larger than a spring constant of the first vibrating reed 14a and the second vibrating reed 14b.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. An angular velocity sensor, comprising:
a substrate made of a piezoelectric material;
a vibrating member provided to the substrate and having a first vibrating reed and a second vibrating reed vibrating in plane directions of the substrate; and
an outer peripheral section provided to the substrate and disposed on a periphery of the vibrating member, wherein
when an angular velocity is applied to the vibrating member that is vibrating, the vibrating member generates charges corresponding to the angular velocity,
when one direction of the plane directions of the substrate is a first direction and a direction of the plane directions of the substrate perpendicular to the first direction is a second direction, the vibrating member is supported at the outer peripheral section via a plurality of beam sections having first beam-configuring members that can displace at least in the first direction and second beam-configuring members that are joined to the first beam-configuring members and that can displace at least in the second direction,
the vibrating member has a base section supporting the first vibrating reed and the second vibrating reed both protruding in a same direction,
in at least a subset of the plurality of beam sections, beam-configuring members on a side of the outer peripheral section among the first beam-configuring members and the second beam-configuring members are integrated with each other, and
when an impact in a direction along an alignment direction of the first vibrating reed and the second vibrating reed is applied to the first vibrating reed, the second vibrating reed, and the base section, let f1 be a resonance frequency in an in-phase mode in which the first vibrating reed, the second vibrating reed, and the base section vibrate in a same direction, f3 be a resonance frequency in an in-phase absorption mode in which a group of the first vibrating reed and the second vibrating reed, and the base section, vibrate in opposite directions, and n be an integer, the resonance frequency f3 in the in-phase absorption mode is higher than the resonance frequency f1 in the in-phase mode and a relation where an absolute value Δf3, which is a difference between the resonance frequency f3 in the in-phase absorption mode and a value n times the resonance frequency f1 in the in-phase mode, is greater than a product found by multiplying the resonance frequency f1 in the in-phase mode by an avoidant difference D, which indicates a degree of gap of the absolute value Δf3 from the resonance frequency f1 in the in-phase mode, is satisfied while the avoidant difference D is set to be greater than 0%.

2. The angular velocity sensor according to claim 1, wherein
a frame section is provided between the vibrating member and the outer peripheral section, and
in the plurality of beam sections, all of the beam-configuring members on the side of the outer peripheral section among the first beam-configuring members and the second beam-configuring members are formed of the frame section and integrated with one another.

3. The angular velocity sensor according to claim 1, wherein
a spring constant of the plurality of beam sections is set to be smaller than a spring constant of the first vibrating reed and the second vibrating reed.

4. The angular velocity sensor according to claim 1, wherein
when a differential amplification is applied to charges generated at the first vibrating reed and the second vibrating reed, the first vibrating reed and the second vibrating reed detect the angular velocity, and
when a direction perpendicular to the first direction and the second direction is a third direction, the first vibrating reed and the second vibrating reed vibrate in the third direction oppositely to each other when the angular velocity is applied to the first vibrating reed and the second vibrating reed while the first vibrating reed and the second vibrating reed are driven to vibrate in the first direction, the first vibrating reed and the second vibrating reed have a resonance frequency fin in an in-phase mode in which the first vibrating reed and the second vibrating reed vibrate in a same direction along the third direction and a resonance frequency fanti in an anti-phase mode in which the first vibrating reed and the second vibrating reed vibrate in directions opposite to each other along the third direction when an impact along the third direction is applied to the first vibrating reed and the second vibrating reed, and an absolute value of a decoupling ratio, which is defined as a quotient found by dividing a difference between the resonance frequency fanti in the anti-phase mode and the resonance frequency fin in the in-phase mode by the resonance frequency fanti in the anti-phase mode (=fanti−fin)/fanti), is set to 0.2 or greater.

* * * * *